(12) United States Patent
Johnson

(10) Patent No.: US 10,007,077 B2
(45) Date of Patent: Jun. 26, 2018

(54) DIRECT IMPINGEMENT COOLING OF FIBERS

(71) Applicant: BAE Systems Information and Electronics Systems Integration Inc., Nashua, NH (US)

(72) Inventor: Benjamin R. Johnson, Nottingham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 211 days.

(21) Appl. No.: 14/440,378

(22) PCT Filed: Aug. 21, 2014

(86) PCT No.: PCT/US2014/052089
§ 371 (c)(1),
(2) Date: May 4, 2015

(87) PCT Pub. No.: WO2015/034681
PCT Pub. Date: Mar. 12, 2015

(65) Prior Publication Data
US 2015/0277073 A1    Oct. 1, 2015

Related U.S. Application Data

(60) Provisional application No. 61/873,505, filed on Sep. 4, 2013.

(51) Int. Cl.
*F28F 1/00* (2006.01)
*G02B 6/44* (2006.01)
(Continued)

(52) U.S. Cl.
CPC .............. *G02B 6/44* (2013.01); *H01S 3/0407* (2013.01); *H01S 3/06704* (2013.01);
(Continued)

(58) Field of Classification Search
CPC ...... G02B 6/44; G02B 6/10; C03B 37/02718; C03B 37/07; C03B 37/10; H01S 3/0407; H01S 3/06704; H01S 3/0401; H01S 3/042
(Continued)

(56) References Cited

U.S. PATENT DOCUMENTS

| | | | |
|---|---|---|---|
| 4,782,669 A * | 11/1988 | Trocciola | H01M 8/04007 |
| | | | 165/104.17 |
| 4,945,457 A | 7/1990 | Yazdani et al. | |
| 5,043,001 A | 8/1991 | Cain et al. | |
| 5,827,267 A | 10/1998 | Savage et al. | |

(Continued)

FOREIGN PATENT DOCUMENTS

| | | |
|---|---|---|
| JP | 2008021899 A | 1/2008 |
| WO | 2014146650 A1 | 9/2014 |

OTHER PUBLICATIONS

PCT/US14/052089, ISR dated Dec. 17, 2014.
Tokita, Shigeki, et al. "Liquid-cooled 24 W mid-infrared Er: ZBLAN fiber laser." Optics letters 34.20 (2009): 3062-3064.

*Primary Examiner* — Davis Hwu
(74) *Attorney, Agent, or Firm* — Sand & Sebolt, LPA

(57) ABSTRACT

A system provides for a way for cooling an optical fiber. The system includes a coolant and a conduit. The conduit allows the coolant to flow through the conduit. At least part of the fiber passes through the conduit allowing the coolant to flow around the at least part of the fiber. In some configurations, the fiber runs parallel to the conduit. The system can include a pump diode that is part of an optical laser connected to an end of the fiber. The optical laser can further include a high reflector connected to the fiber and a partial reflector connected to the fiber to reflect some light back and forth between the high reflector and the partial reflector.

18 Claims, 3 Drawing Sheets

(51) Int. Cl.
*H01S 3/067* (2006.01)
*H01S 3/094* (2006.01)
*H01S 3/0941* (2006.01)
*H01S 5/024* (2006.01)
*H01S 3/04* (2006.01)
*H01S 3/042* (2006.01)

(52) U.S. Cl.
CPC .............. *H01S 3/0401* (2013.01); *H01S 3/042* (2013.01); *H01S 3/0404* (2013.01); *H01S 3/0675* (2013.01); *H01S 3/09415* (2013.01); *H01S 3/094003* (2013.01); *H01S 5/0243* (2013.01); *H01S 5/02423* (2013.01)

(58) Field of Classification Search
USPC .............................................. 165/104.17, 155
See application file for complete search history.

(56) References Cited

U.S. PATENT DOCUMENTS

| | | | |
|---|---|---|---|
| 6,072,814 A * | 6/2000 | Ryan | G02B 6/4204 372/35 |
| 6,167,177 A | 12/2000 | Sandstrom et al. | |
| 6,330,259 B1 | 12/2001 | Dahm | |
| 6,407,855 B1 * | 6/2002 | MacCormack | H01S 3/0812 359/346 |
| 8,230,704 B2 * | 7/2012 | Cummings | C03B 37/02718 165/155 |
| 2004/0213302 A1 * | 10/2004 | Fermann | H01S 3/06754 372/6 |
| 2005/0220429 A1 | 10/2005 | Davis | |
| 2007/0280304 A1 * | 12/2007 | Deile | G02B 6/023 372/6 |
| 2008/0247424 A1 | 10/2008 | Sacks et al. | |
| 2013/0028276 A1 | 1/2013 | Minelly et al. | |

* cited by examiner

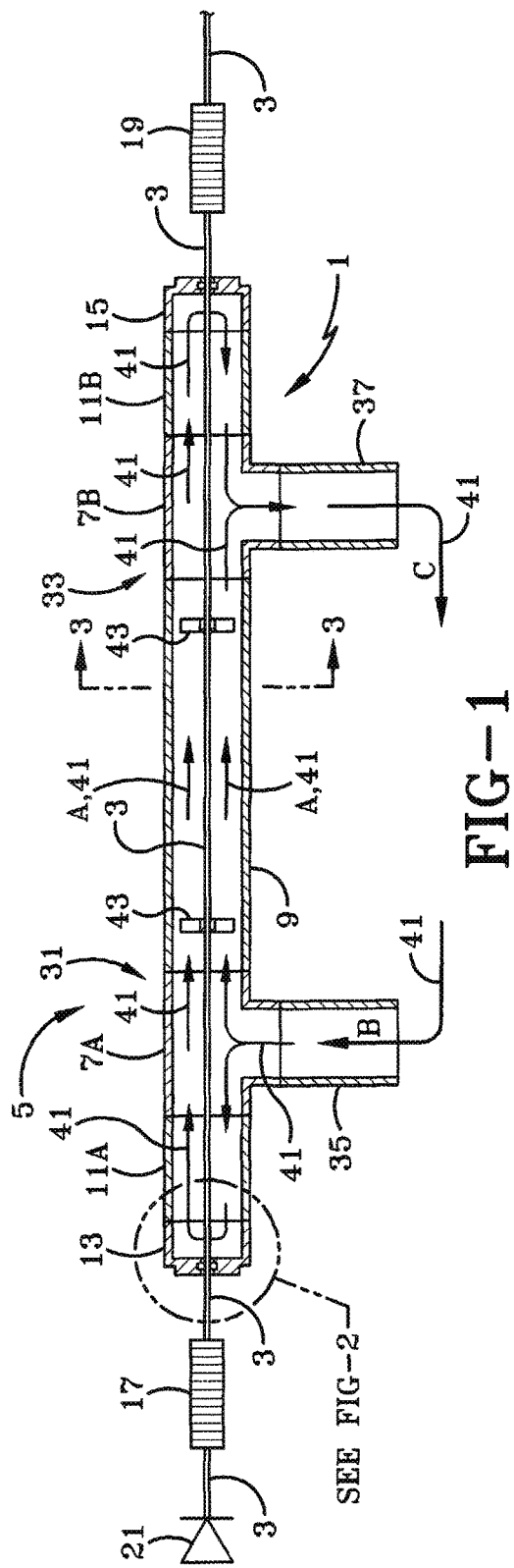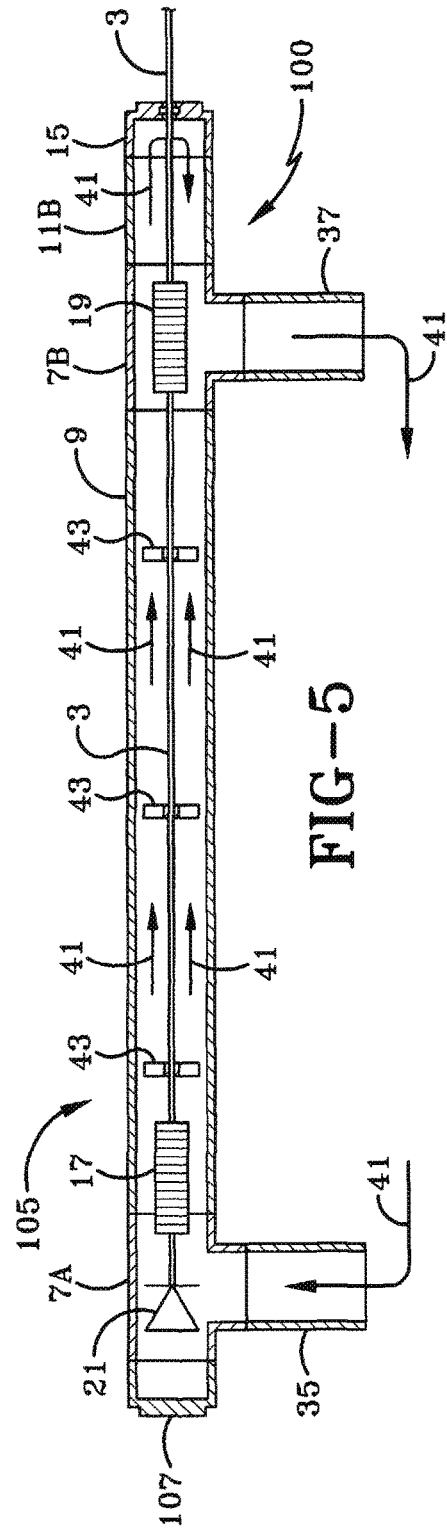
FIG-1
FIG-5

DIRECT IMPINGEMENT COOLING OF FIBERS

CROSS REFERENCE TO RELATED APPLICATION

This application claims priority from U.S. Provisional Application No. 61/873,505, filed Sep. 4, 2013; the disclosure of which is incorporated herein by reference.

BACKGROUND OF THE INVENTION

1. Field of Invention

The current invention relates generally to apparatus, systems and methods for cooling optical fibers. More particularly, the apparatus, systems and methods relate to using a liquid to cool fibers. Specifically, the apparatus, systems and methods provide for actively flowing a fluid across fibers to cool the fibers.

2. Description of Related Art

Fiber optic lasers generally use very long lengths of fiber as the doped gain medium is often several meters long. Fibers also have very high specific volumes (the ratio of surface area to object volume) which provide large areas available for heat transfer. These two properties allow fiber lasers to have 10 kW or more of optical power. However, the size of optical fibers (diameters often well below 1 mm) lends them to difficulties in implementing thermal management systems that fully exploit the thermal properties of optical fibers. Fiber optic lasers are commonly cooled using a bath technique. The heat flux of the fibers is high enough to cause a local heating effect in the fiber due to the stagnation of water in a bath-type configuration; even with a circulator. The fiber may even get hot enough to boil the water in the region surrounding the fiber. The primary limiting factor in power scaling of high power fiber lasers is the temperature of the outermost polymer cladding as its failure temperature is significantly lower than that of the fiber glass. So, efficient removal of heat without incurring a significant increase in polymer temperature is essential for high power fiber lasers. The fiber-in-spool thermal management scheme often results in fiber temperatures many dozens of degrees (C or F) of temperature difference between the fiber and the working fluid. What is needed is a better way of cooling fiber lasers and fibers in general.

SUMMARY

One aspect of an embodiment of the invention includes a system for cooling an optical fiber. The system includes a coolant and a conduit. The conduit allows the coolant to flow through the conduit. At least part of the fiber passes through the conduit allowing the coolant to flow around the at least part of the fiber. In some configurations, the fiber runs parallel to the conduit. The system can include a pump diode that is part of an optical laser connected to an end of the fiber. The optical laser can further include a high reflector connected to the fiber and a partial reflector connected to the fiber to reflect some light back and forth between the high reflector and the partial reflector.

In one aspect the invention/another embodiment may provide for a method of cooling an optical fiber. The method actively flows a liquid coolant parallel to the fiber so that the liquid coolant directly impinges on the fiber. In some embodiments the method actively flows the fluid along the fiber that is part of a fiber laser as discussed later. The actively flowing a liquid, in some embodiments, can include actively flowing water as the coolant and can include flowing the liquid inside an elongated conduit in which the fiber is located. The method can locate the fiber at a central axis of the conduit so that the fiber runs generally parallel to the conduit. In some embodiments, the fiber is a first fiber and the method additionally actively flows the liquid parallel to a second fiber inside the conduit. The method can recirculate the liquid coolant by re-cooling liquid coolant exiting at a first end of the conduit and re-injecting re-cooled liquid coolant into a second end of the conduit.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 1 illustrates a preferred embodiment of a fiber cooling system.

FIG. 5 illustrates another configuration of a fiber cooling system that cools a fiber as well as other components of a fiber laser in a conduit.

Similar numbers refer to similar parts throughout the drawings.

DETAILED DESCRIPTION

Figure 2:
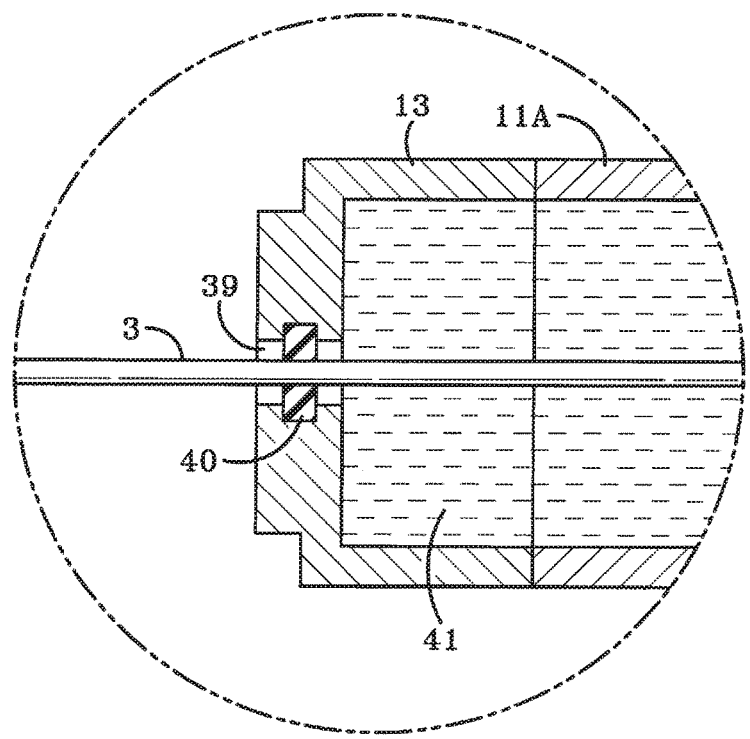
FIG. 2 illustrates an example of the preferred embodiment of a fiber cooling system with the fiber located in the center of a conduit.

While the preferred embodiment is described with respect to cooling a fiber optic laser, it is understood that the preferred embodiment can be applied to cool any type of fiber optic cable where heat or high stress is an issue for the fiber. FIG. 1 illustrates the preferred embodiment of a fiber cooling system 1 that is used to cool a fiber optic line 3 that is used as part of a fiber laser 5. The fiber 3 can be a rare earth doped fiber or another kind of fiber as understood by those of ordinary skill in this art.

The fiber cooling system 1 includes a main conduit 9 with a first end 31 and a second end 32. The main conduit 9 has T-connectors 7A/B connected on each end of the main conduit 9. A first conduit section 11A and a second conduit section 11B are connected to the first and left ends 31, 33 respectively. An input conduit 35 is connected to left T-Connector 11A and an output conduit 37 is connected to right T-connector 11B as illustrated. In the preferred embodiment all of these conduits are cylindrical in shape but they can also be other shapes.

The fiber cooling system 1 further includes a coupler 13 at its left end 31 and a coupler 15 at its right end 33. Preferably these are low stress couplers to spread out a stress exerted on the fiber 3 by a liquid (discussed below) inside the couplers 13, 15 but they can be any type of coupler as understood by one of ordinary skill in this art. The fiber 3 passes through the main conduit 9, the T-connectors 7A/B, the first and second conduit sections 11A/B and out of the couplers 13, 15 reaching a high reflector 17 at its first end 31 and a partial reflector 19 at its second end 33. The reflectors 17, 19 can be any appropriate reflectors for reflecting light in the fiber 3 as understood by one of ordinary skill in this art.

A diode 21 is connected to the fiber 3 at a first end of the fiber laser 5. The diode 21 is a pump diode for injecting light energy into the fiber 3. This diode can be any other type of device as understood by one of ordinary skill in this art.

In the preferred embodiment, the conduits of the fiber cooling system are filled with a liquid coolant and in the preferred embodiment the coolant is water. As discussed later, the water 41 causes the fiber cooling system 1 to act as an active heat removal system verse a passive system. Pass prior art systems often used a standing pool of water that generally was stationary around the fiber. However, the novel fiber cooling system 1 actively circulates the water 41 through the conduits so that the actively moving water directly impinges on the fiber 3.

The fiber 3 can be located in the center of the main conduit 9, the T-connectors 7A/B and the first and second conduit sections 11A/B in a variety of ways. For example, one way to locate the fiber 3 in the center of the conduits is to stretch it between central openings 39 (FIG. 2) of the two couplers 13, 15. Inside these couplers 13, 15 there may be a pressure reducing device that eventually contacts the fiber 3 and holds it in a central position. An O-ring 40 can also be used around the fiber 3 where it exits (or enters) a coupler to seal the water 41 inside the coupler and act to apply some tension on the fiber. The fiber can be centered within the conduits by stretching the fiber between the connectors 13, 15 so that the connectors act to provide a bit of tension that holds the fiber 3 in place.

Figures 3, 4:
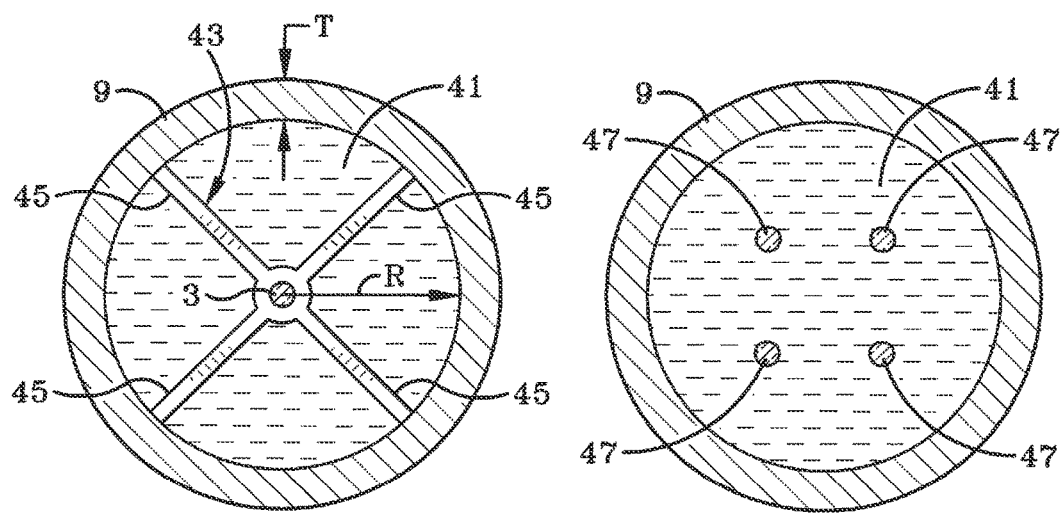
FIG. 3 illustrates an example of the preferred embodiment of a fiber cooling system with a spacer positioning the fiber in the center of a conduit.
FIG. 4 illustrates another configuration of a fiber cooling system that cools four fibers in a conduit.

FIG. 3 a detailed view of a spacer 43 that can be used to physically locate the fiber 3 in the center of the main conductor 9. In this example figure, the spacer 43 has four arms 45 that are spaced 90 degrees apart and that are used to physically hold the fiber 3 in the center of the conduit 9. These arms 45 can be connected together by supporting/connecting structures as understood by one of ordinary skill in the art. However, there should be plenty of open area around the spacer 43 to allow the water 41 to freely flow around through the spacer 43 and around the fiber 3.

In the preferred embodiment, the conduits are cylindrical in shape as is also best seen in FIG. 3. For example, the main conduit 9 has a radius R from its center to its inside edge. The radius R is generally between ½ or one inch but it can be any value desired. The length of the main conduit is typically a few meters but other lengths can be used. The thickness T of a wall of the main conduit 9 is large enough so that it provides adequate stiffness to the conduit.

Having described the components of the cooling system of FIGS. 1-3, its use and operation will now be described. While in operation the fiber laser 5 converts electrical energy into optical energy. This optical energy reflects back and forth between the high reflector 17 and the partial reflector 19. This turns some of this optical energy into mechanical heat energy at these reflectors 17, 19 and in the fiber 3. To cool the fiber 3 a liquid such as water 41 is circulated through the conduit components of the fiber cooling system 1 in the direction of arrows A (FIG. 1) so that the coolant directly impinges the fiber 3 and actively cools the fiber 3.

New cold coolant (e.g., water 41) enters the fiber cooling system 1 through input conduit 35 in the direction of arrow B and output coolant exits the fiber cooling system 1 from output conduit 37 in the direction of arrow C. After leaving the system the coolant is re-cooled by any method as understood by those of ordinary skill in this art before the coolant re-injected back into the input conduit 35. The coolant can be pressurized to flow through the main conduit 9 with a pump or in another way as understood by those of ordinary skill in this art.

In other embodiments, other numbers of fibers can be located in the conduit. For example, FIG. 4 illustrates four fibers 47 located in the main conduit 9. Preferably these four fibers 47 are routed parallel to each other. Any number of fibers can be used as long as coolant preferably flows over the surfaces of each fiber 47.

FIG. 5 illustrates another embodiment where a fiber laser 105 is entirely located within a fiber cooling system 100. Notice that in this embodiment the pump diode 21, the high reflector 17 and the partial reflector 19 are located inside the fiber cooling system 100 so that these components are also cooled. The first T-connector 7A is again used except now a first cap 107 is used to seal a left end of the T-connector because the diode 21 is entirely within the fiber cooling system 100 and no fiber extends out of the first end of the conduit. Other components of the fiber cooling system 100 are similar to those described in FIG. 1. In use, the fiber cooling system 100 of FIG. 5 operates similar to the fiber cooling system of FIG. 1 except that now the diode 21 and reflectors 17, 19 are inside the conduits carrying the coolant 41 so that they are now also cooled by the coolant 41.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 6:
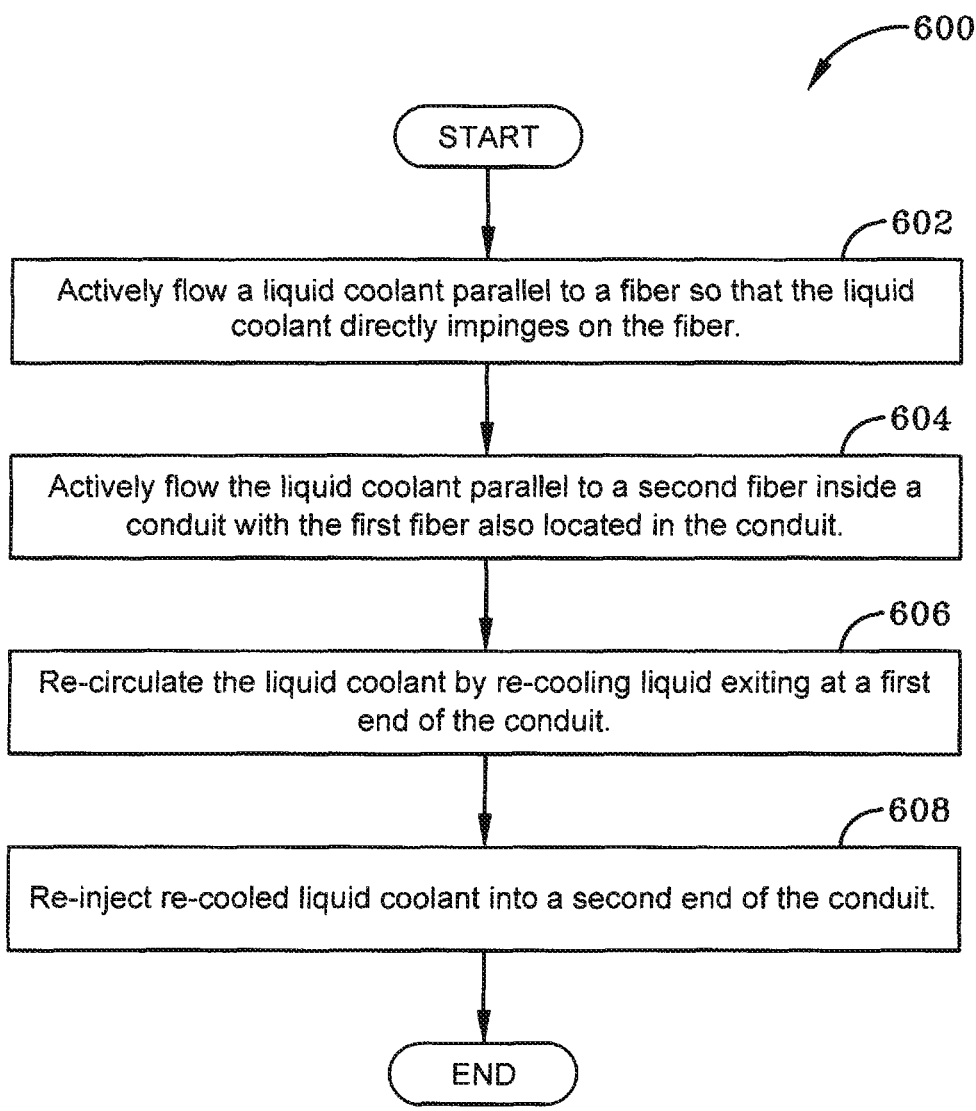
FIG. 6 illustrates an embodiment of a method for cooling a fiber.

FIG. 6 illustrates a method 600 of cooling an optical fiber. The method 600 actively flows a liquid coolant parallel to the fiber, at 602, so that the liquid coolant directly impinges on the fiber. In some embodiments the method 600 actively flows the fluid along the fiber that is part of a fiber laser as discussed above. The actively flowing a liquid, in some embodiments, can include actively flowing water as the coolant and can include flowing the liquid inside an elongated conduit as well as other conduit components as discussed above. The method 600 can locate the fiber at a central axis of the conduit so that the fiber runs generally parallel to the conduit. In some embodiments, the fiber is a first fiber and the method 600 additionally actively flows the liquid parallel to a second fiber inside the conduit, at 604, with the first fiber also in the conduit. The method 600 recirculates the liquid coolant by re-cooling liquid exiting at a first end of the conduit, at 606, and re-injects re-cooled liquid coolant into a second end of the conduit, at 608.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A method of cooling an optical fiber during laser beam generation comprising:
   receiving optical energy in a prefabricated completely solid and non-hollow static optical fiber;
   reflecting the optical energy along the completely solid static optical fiber between a first reflector and a second reflector to generate a laser beam, wherein the reflecting turns some of the optical energy into mechanical heat energy;
   actively flowing a liquid coolant inside a main conduit from an input conduit adjacent to an outer surface of the completely solid and non-hollow static optical fiber to an output conduit so that the liquid coolant directly impinges on the outer surface of the completely solid and non-hollow static optical fiber while the laser beam is generated and the completely solid static optical fiber precludes the liquid coolant from impinging the optical fiber at a location other than the outer surface, wherein the main conduit is coupled with the input conduit and the output conduit in a manner to maintain the coolant in a pressurized state;
   tensioning the completely solid and non-hollow static optical fiber with a first low stress coupler connected to a first end of the main conduit and with a second low stress coupler connected to a second end of the main conduit, wherein the input conduit and the output conduit are located between the first and second low stress couplers; and
   reducing stress and pressure on the completely solid and non-hollow static optical fiber with the first low stress coupler connected to the first end of the main conduit, and an O-ring in the first low stress coupler extending around the completely solid and non-hollow static optical fiber, and reducing stress and pressure on the completely solid and non-hollow static optical fiber with the second low stress coupler connected to the second end of the conduit, and an O-ring in the second low stress coupler extending around the solid static optical fiber.

2. The method of cooling an optical fiber of claim 1 further comprising:
   actively flowing the liquid coolant parallel to the outer surface of the completely solid and non-hollow static optical fiber that is part of a fiber laser between the first reflector and the second reflector, wherein the first reflector and the second reflector are exterior to the main conduit.

3. The method of cooling an optical fiber of claim 1 wherein the actively flowing a liquid further comprises: actively flowing water parallel to a longitudinal axis of the completely solid and non-hollow static optical fiber.

4. The method of cooling an optical fiber of claim 2 wherein the main conduit is a cylindrically shaped conduit and further comprising:
   maintaining the completely solid and non-hollow static optical fiber at a central axis of the conduit and parallel to the main conduit with the low stress coupler at each end of the main conduit, wherein each O-ring extends around the completely solid and non-hollow static optical fiber; and
   spreading out a stress exerted on the completely solid and non-hollow static optical fiber by the liquid coolant directly impinging the completely solid and non-hollow static optical fiber.

5. The method of cooling an optical fiber of claim 2 wherein the solid static optical fiber is a first fiber and further comprising:
   actively flowing a liquid coolant parallel to a second fiber inside the conduit; and
   reducing pressure on the completely solid and non-hollow static optical fiber with a pressure reducing device that retains the completely solid and non-hollow static optical fiber centrally in the main conduit.

6. The method of cooling an optical fiber of claim 2 further comprising:
   re-cooling liquid coolant exiting near the first end of the main conduit; and
   re-injecting re-cooled liquid coolant near the second end of the main conduit.

7. The method of cooling an optical fiber of claim 4 further comprising:
   placing a spacer between the elongated conduit and the completely solid and non-hollow static optical fiber to space the completely solid and non-hollow static optical fiber away from the main conduit and still allow the liquid coolant to impinge the outer surface of the completely solid and non-hollow static optical fiber;
   wherein the spacer positions the completely solid and non-hollow static optical fiber centrally in the main conduit and the spacer is located inside the main conduit between the input conduit and the output conduit.

8. The method of cooling an optical fiber of claim 1 further comprising:
   pumping light into the solid static optical fiber with a pump diode that is part of a fiber laser, wherein the pump diode is exterior to the main conduit and exterior to the first and second low stress couplers connected to the main conduit.

9. A system for cooling an optical fiber during laser beam generation comprising:
   a prefabricated solid static optical fiber adapted to receive optical energy;
   a first reflector and a second reflector positioned along the solid static optical fiber adapted to reflect optical energy therebetween and generate a laser beam;
   a liquid coolant;
   a conduit adapted to allow the coolant to flow through the conduit, wherein the first reflector and the second reflector are inside the conduit;

wherein at least part of the solid static optical fiber passes through the conduit allowing the coolant to flow at least parallel to at least part of an outer surface of the solid static optical fiber to impinge and actively cool the solid static optical fiber while the laser beam is generated and actively cool the first reflector and the second reflector inside the conduit;

wherein the coolant flows in one direction parallel to the solid static optical fiber;

wherein the first reflector is a high reflector connected to the solid static optical fiber;

wherein the second reflector is a partial reflector connected to the solid static optical fiber to reflect some light back and forth between the high reflector and the partial reflector;

a first low stress coupler connected to a first end of the conduit to reduce stress on the solid static optical fiber and pressure in the optical fiber, and an O-ring in the first low stress coupler extending around the solid static optical fiber;

a second low stress coupler connected to the second end of the conduit to reduce stress on the solid static optical fiber and pressure in the optical fiber, and an O-ring in the second low stress coupler extending around the solid static optical fiber;

a coolant input conduit in fluid communication with the conduit;

a coolant output conduit in fluid communication with the conduit, wherein the coolant input conduit and the coolant output conduit are located between the first low stress coupler and the second low stress coupler; and wherein the conduit is coupled with the coolant input conduit and the coolant output conduit in a manner to maintain the coolant in a pressurized state.

10. The system for cooling an optical fiber of claim 9 wherein the at least part of the solid static optical fiber runs parallel to the conduit.

11. The system for cooling an optical fiber of claim 9 wherein a pump diode is located within the conduit and is adapted to be cooled by the coolant.

12. The system for cooling an optical fiber of claim 9 wherein the solid static optical fiber is a first optical fiber and the system further comprising:
a second solid static optical fiber in the conduit allowing the coolant to flow around the second solid static optical fiber to cool the second solid static optical fiber.

13. The system for cooling an optical fiber of claim 12 wherein the second solid static optical fiber runs generally parallel to the first solid static optical fiber in the conduit.

14. The system for cooling an optical fiber of claim 9 further comprising:
a spacer configured to position the solid static optical fiber near a center of the conduit, wherein the spaced is located inside the conduit between the coolant input conduit and the coolant output conduit.

15. The system for cooling an optical fiber of claim 9 wherein the coolant is water.

16. The system for cooling an optical fiber of claim 9 wherein the conduit is cylindrical in shape.

17. The method of claim 1, wherein prior to receiving optical energy in the solid static optical fiber comprises: converting electrical energy into optical energy.

18. The method of claim 1, further comprising:
maintaining the completely solid static optical fiber in tension with at least one low stress coupler connected to the completely solid static optical fiber via the O-ring surrounding completely solid static optical fiber within the first and second low stress couplers.

* * * * *